United States Patent
Akita

(10) Patent No.: US 9,526,172 B2
(45) Date of Patent: Dec. 20, 2016

(54) WIRING SUBSTRATE

(71) Applicant: NGK SPARK PLUG CO., LTD., Nagoya-shi, Aichi-ken (JP)

(72) Inventor: Kazushige Akita, Nagoya (JP)

(73) Assignee: NGK SPARK PLUG CO., LTD., Nagoya (JP)

(*) Notice: Subject to any disclaimer, the term of this patent is extended or adjusted under 35 U.S.C. 154(b) by 0 days.

(21) Appl. No.: 14/818,048

(22) Filed: Aug. 4, 2015

(65) Prior Publication Data
US 2016/0044787 A1    Feb. 11, 2016

(30) Foreign Application Priority Data
Aug. 5, 2014 (JP) .................. 2014-159878

(51) Int. Cl.
H05K 1/11 (2006.01)
H01L 23/12 (2006.01)

(52) U.S. Cl.
CPC .............. *H05K 1/113* (2013.01); *H01L 23/12* (2013.01); *H05K 2201/09563* (2013.01); *H05K 2201/2018* (2013.01)

(58) Field of Classification Search
CPC ................................. H05K 1/14; H05K 3/32
USPC ..... 174/264, 260, 363, 372; 361/98, 679.55, 361/761; 257/696, 722, 773
See application file for complete search history.

(56) References Cited

U.S. PATENT DOCUMENTS

| | | | | |
|---|---|---|---|---|
| 3,877,064 A | * | 4/1975 | Scheingold ......... | H05K 7/1069 257/696 |
| 4,347,913 A | * | 9/1982 | Cromer, Jr. ........... | A01M 31/02 182/142 |
| 4,369,763 A | * | 1/1983 | Sullivan ................. | A47J 36/26 108/50.18 |
| 4,516,375 A | * | 5/1985 | Pagano .................... | E04C 1/40 52/581 |
| 4,630,875 A | * | 12/1986 | Korsunsky ........... | H05K 7/1007 439/152 |
| 4,758,927 A | * | 7/1988 | Berg ...................... | H05K 3/325 29/827 |
| 4,791,975 A | * | 12/1988 | Wuepper ................. | B22C 21/02 164/29 |

(Continued)

FOREIGN PATENT DOCUMENTS

| | | |
|---|---|---|
| JP | 3538774 B2 | 4/2004 |
| JP | 4072300 B2 | 1/2008 |

*Primary Examiner* — Xiaoliang Chen
(74) *Attorney, Agent, or Firm* — Stites & Harbison, PLLC; Jeffrey A. Haeberlin; James R. Hayne

(57) ABSTRACT

A wiring substrate includes an insulating substrate having a quadrangular planar outline; a quadrangular frame positioned on the surface of the insulating substrate along the periphery, and including an upper surface, a corner portion, and an adjacent portion, the corner portion including a width-expanded portion defining a via hole extending through the frame, the width-expanded portion including an inner wall surface having a rectilinear edge in a plan view, the adjacent portion including an inner wall surface, the inner wall surface of the width-expanded portion forming an obtuse angle with the inner wall surface of the adjacent portion; a via conductor filling the via hole and not exposed from the inner wall surface of the width-expanded portion; and a sealing metallization layer formed on the upper surface of the frame and electrically connected to the via conductor.

2 Claims, 2 Drawing Sheets

(56) References Cited

U.S. PATENT DOCUMENTS

| | | | | |
|---|---|---|---|---|
| 4,899,806 | A | * | 2/1990 | Wuepper ................. B22C 21/02 164/374 |
| 6,164,981 | A | * | 12/2000 | Lin ..................... H05K 7/1084 174/260 |
| 6,700,448 | B1 | * | 3/2004 | Knecht ................... H03B 1/02 331/158 |
| 8,861,198 | B1 | * | 10/2014 | Asuncion ............... G06F 1/1658 361/679.3 |
| 2002/0166683 | A1 | * | 11/2002 | Shlahtichman ...... H05K 9/0032 174/363 |
| 2004/0135645 | A1 | * | 7/2004 | Koyama .............. H03H 9/1021 331/158 |
| 2012/0037939 | A1 | * | 2/2012 | Urano .................. H01L 33/486 257/98 |
| 2012/0098390 | A1 | * | 4/2012 | Takahashi ............ H03H 9/1035 310/348 |
| 2012/0285637 | A1 | * | 11/2012 | Kasuya .................. B41F 15/36 160/369 |
| 2014/0262473 | A1 | * | 9/2014 | Robinson ............. H05K 9/0032 174/372 |
| 2014/0285074 | A1 | * | 9/2014 | Mori ........................ H05K 7/18 312/223.2 |
| 2014/0306729 | A1 | * | 10/2014 | Chen .................. G01R 31/2889 324/750.22 |

\* cited by examiner

WIRING SUBSTRATE

CROSS REFERENCE TO RELATED APPLICATIONS

The present application claims priority from Japanese Patent Application No. 2014-159878, which was filed on Aug. 5, 2014, the disclosure of which is herein incorporated by reference in its entirety.

BACKGROUND OF THE INVENTION

Field of the Invention

The present invention relates to a wiring substrate for mounting thereon an electronic component such as a semiconductor device or a quartz oscillator.

Description of Related Art

There is a wiring substrate for use in a package for sealing in an electronic component such as a semiconductor device or a quartz oscillator. The wiring substrate includes an insulating substrate for mounting thereon an electronic component, and a frame which is provided on the front surface of the insulating substrate along the periphery of the surface in such a manner as to surround a mounting region for an electronic component and which defines a cavity for accommodating therein the electronic component. Usually, a sealing metallization layer is formed on an upper surface of the frame, and a via conductor is formed through the frame for connecting the metallization layer and external terminals formed on the back surface of the substrate.

In recent years, in association with a reduction in the size of an electronic component to be mounted thereon, the wiring substrate has been reduced in size. Thus, in addition to reduction in the outside dimensions (planar dimensions) of the wiring substrate to mount thereon an electronic component, the frame to define a cavity for accommodating therein the electronic component is also reduced in width. As a result, difficulty is encountered in forming a via conductor in the frame for connecting the metallization layer and external terminals formed on the back surface of the substrate.

Thus, in some conventional wiring substrates, portions other than corners of a frame are expanded in width, and via conductors are provided at the width-expanded portions, respectively (refer to, for example, Patent Documents 1 and 2).

RELATED ART DOCUMENTS

Patent Document 1 is Japanese Patent No. 3538774.
Patent Document 2 is Japanese Patent No. 4072300.

BRIEF SUMMARY OF THE INVENTION

However, the inventions described in Patent Documents 1 and 2 involve the following problem: since via conductors are provided at portions other than corners of the frame, a mounting region for an electronic component is reduced in size.

The present invention has been conceived in view of the above circumstances, and an object of the invention is to provide a wiring substrate which secures a wide mounting region for an electronic component and allows a via conductor to be formed in a narrow frame.

In a first aspect of the present invention, a wiring substrate includes an insulating substrate having a substantially quadrangular planar shape (i.e., quadrangular planar outline) and including a surface having a periphery and a mounting region for mounting of an electronic component; a frame having a substantially quadrangular shape (i.e., a quadrangular frame), positioned on the surface of the insulating substrate along the periphery of the surface, and surrounding the mounting region (i.e., in such a manner as to surround the mounting region), the frame defining a cavity for accommodating therein the electronic component and including an upper surface, a corner portion, and an adjacent portion to the corner portion, the corner portion including a width-expanded portion expanding toward the mounting region (i.e., the frame being such that, as viewed in plane, the corner portion assumes the form of a width-expanded portion expanding toward the mounting region) and defining a via hole having a diameter of 100 μm or less (i.e., the via hole formed at the corner portion of the frame), and extending through the frame in a thickness direction of the frame, the width-expanded portion including an inner wall surface having a rectilinear edge in a plan view (i.e., the width-expanded portion is, as viewed in plane, such that an inner wall surface thereof is rectilinear), the adjacent portion including an inner wall surface and having a width of 150 μm or less (i.e., a portion other than the corner portion has a width of 150 μm or less), and the inner wall surface of the width-expanded portion forming an obtuse angle with the inner wall surface of the adjacent portion (i.e., the inner wall surface of the width-expanded portion and an inner wall surface of the frame adjacent to the inner wall surface of the width-expanded portion form an obtuse angle); a via conductor filling the via hole and not exposed from the inner wall surface of the width-expanded portion (i.e., the frame adapted to define the cavity); and a sealing metallization layer formed on the upper surface of the frame and electrically connected to the via conductor.

According to the first aspect of the present invention, the frame is such that a corner portion assumes the form of a width-expanded portion expanding toward the mounting region, and the width-expanded portion is, as viewed in plane, such that the inner wall surface thereof is rectilinear, and the inner wall surface of the width-expanded portion and an inner wall surface of the frame adjacent to the inner wall surface of the width-expanded portion form an obtuse angle. Thus, even though a portion other than the corner portion of the frame has a width of 150 μm or less, while a wide mounting region for an electronic component is secured, a via conductor can be formed in the frame. Also, since the inner wall surface of the width-expanded portion is rectilinear, stamping workability is improved in manufacturing the frame by use of a die. Thus, the productivity of the frames is improved. Furthermore, since the via conductor is not exposed from the inner wall surface of the frame, there can be restrained the risk that a brazing material disposed on the sealing metallization layer flows along the via conductor and undesirably comes into contact with a terminal of an electronic component.

In accordance with a second aspect of the present invention, a wiring substrate includes an insulating substrate having a substantially quadrangular planar shape (i.e., a quadrangular planar outline) and including a surface having a periphery and a mounting region for mounting of an electronic component; a frame having a substantially quadrangular shape (i.e., a quadrangular frame) positioned on the surface of the insulating substrate along the periphery of the surface, and surrounding the mounting region (i.e., in such a manner as to surround the mounting region), the frame defining a cavity for accommodating therein the electronic component and including an upper surface, a corner portion, and an adjacent portion to the corner portion, the corner portion including a width-expanded portion expanding toward the mounting region (i.e., the frame being such that, as viewed in plane, the corner portion assumes the form of a width-expanded portion expanding toward the mounting region) and defining a via hole having a diameter of 100 μm or less (the via hole formed at the corner portion of the frame), and extending through the frame in a thickness direction of the frame, the width-expanded portion including an inner wall surface having a curved edge protruding toward the mounting region in a plan view (i.e., the width-expanded portion is curved such that, as viewed in plane, an inner wall surface thereof protrudes toward the mounting region), the adjacent portion including an inner wall surface and having a width of 150 μm or less (i.e., a portion other than the corner portion has a width of 150 μm or less); a via conductor filling the via hole and not exposed from the inner wall surface of the width-expanded portion (i.e., the frame adapted to define the cavity); and a sealing metallization layer formed on the upper surface of the frame and electrically connected to the via conductor.

According to the second aspect of the present invention, the frame is such that a corner portion assumes the form of a width-expanded portion expanding toward the mounting region, and the width-expanded portion is curved such that, as viewed in plane, the inner wall surface thereof protrudes toward the mounting region. Thus, even though a portion other than the corner portion of the frame has a width of 150 μm or less, while a wide mounting region for an electronic component is secured, a via conductor can be formed in the frame. Also, since the inner wall surface of the width-expanded portion is curved in such a manner as to protrude toward the mounting region, an area where the via conductor can be formed is widened. Furthermore, since the via conductor is not exposed from the inner wall surface of the frame, there can be restrained the risk that a brazing material disposed on the sealing metallization layer flows along the via conductor and undesirably comes into contact with a terminal of an electronic component.

As described above, the present invention can provide a wiring substrate which secures a wide mounting region for an electronic component and allows a via conductor to be formed in a narrow frame.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

First Embodiment

Figure 1:
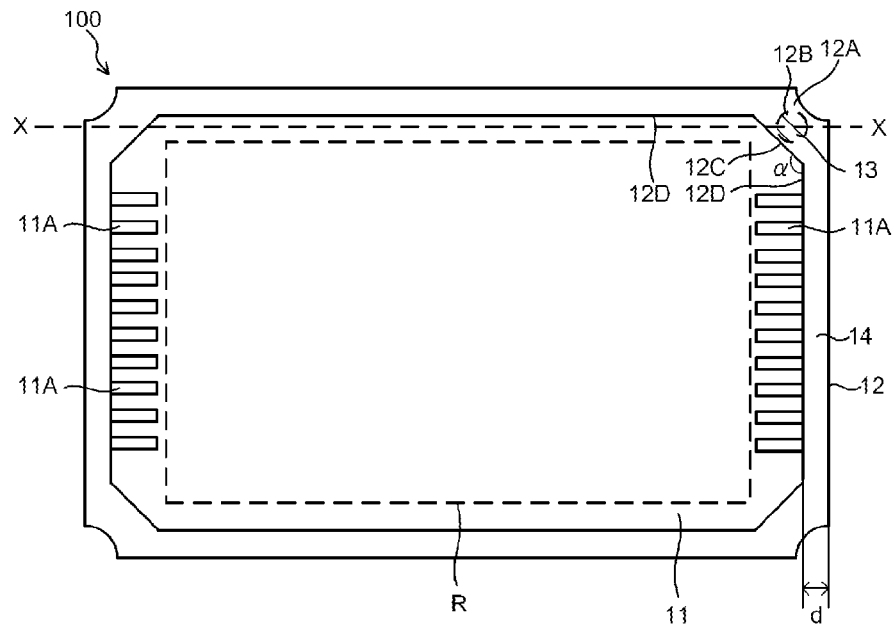
FIG. 1 is a plan view of a wiring substrate according to a first embodiment of the present invention.
Figure 2:
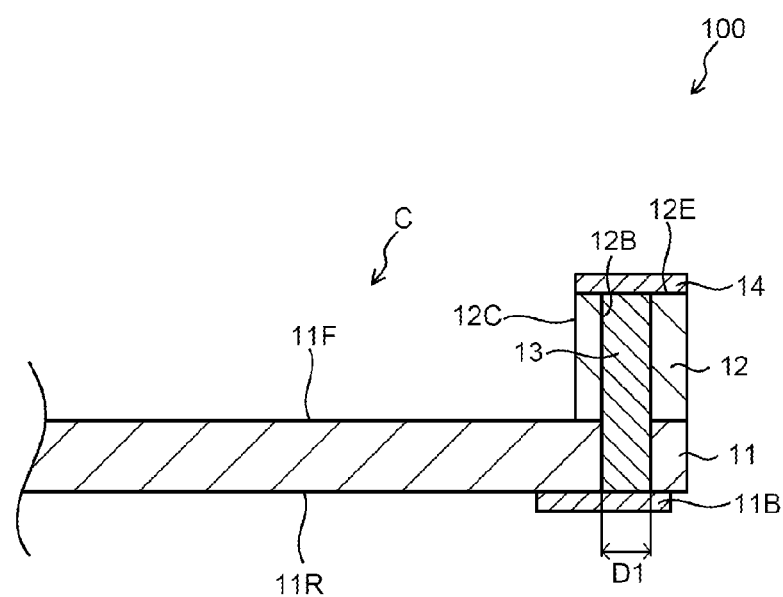
FIG. 2 is an enlarged fragmentary sectional view of the wiring substrate according to the first embodiment.

FIG. 1 is a plan view of a wiring substrate 100 according to a first embodiment of the present invention. FIG. 2 is an enlarged fragmentary sectional view of the wiring substrate 100 taken along broken line X-X of FIG. 1. The wiring substrate 100 according to the first embodiment will next be described with reference to FIGS. 1 and 2.

The wiring substrate 100 includes an insulating substrate 11, a frame 12, a via conductor 13, and a metallization layer 14. The insulating substrate 11 has a mounting region R for an electronic component (not shown) on a front surface 11F and has a substantially rectangular planar outline. The insulating substrate 11 is formed of an electrically insulating ceramic such as alumina ($Al_2O_3$). The insulating substrate 11 has connection terminals 11A (pads) formed on the front surface 11F for connection to an electronic component. Also, the insulating substrate 11 has external connection terminals 11B formed on a back surface 11R for connection to, for example, a motherboard. In the insulating substrate 11, the connection terminals 11A are electrically connected to the external connection terminals 11B through via conductors or the like (not shown). The metallization layer 14, the connection terminals 11A, the external connection terminals 11B, and the via conductors contain, for example, at least one of tungsten (W) and molybdenum (Mo) as a metal component.

The frame 12 is a substantially rectangular frame for defining a cavity C for accommodating therein an electronic component (not shown) and is provided on the front surface 11F of the insulating substrate 11 along the periphery of the front surface 11F in such a manner as to surround the mounting region R. The frame 12 is formed of an electrically insulating ceramic such as alumina ($Al_2O_3$).

In the present embodiment, since a portion other than corner portions has a width d of 150 μm or less, difficulty is encountered in forming, at a portion other than corner portions, a via hole 12B to be filled with the via conductor 13. Thus, as shown in FIG. 1, in the frame 12, as viewed in plane, a corner portion assumes the form of a width-expanded portion 12A expanding toward the mounting region R of the insulating substrate 11, and the via hole 12B is formed in the width-expanded portion 12A.

Also, the width-expanded portion 12A is, as viewed in plane, such that an entire inner wall surface 12C thereof is rectilinear, and the inner wall surface 12C of the width-expanded portion 12A and an inner wall surface 12D of the frame 12 adjacent to the inner wall surface 12C of the width-expanded portion 12A form an obtuse angle α. Also, the sealing metallization layer 14 is formed on an upper surface 12E of the frame 12.

As shown in FIG. 2, the via hole 12B extends through the width-expanded portion 12A of the frame 12 and the insulating substrate 11 in the thickness direction of the frame 12 and the insulating substrate 11 and has a diameter (inside diameter) D1 of 100 μm or less. The via hole 12B is filled with the via conductor 13, which electrically connects the metallization layer 14 and the external connection terminals 11B of the insulating substrate 11. Notably, the via conductor 13 is not exposed from the inner wall surface 12C of the frame 12 which defines the cavity C. The via conductor 13 contains, for example, at least one of tungsten (W) and molybdenum (Mo) as a metal component.

In the wiring substrate 100, exposed metal layer portions, such as the connection terminals 11A, the external connection terminals 11B, the via conductor 13, and the sealing metallization layer 14, are coated with nickel and then with gold or the like. An electronic component (not shown) is mounted in the mounting region R; electrodes of the electronic component and the connection terminals 11A are electrically connected by wire bonding or the like; then, a lid (not shown) is placed in such a manner as to cover the cavity C defined by the frame 12 and is, for example, brazed to the sealing metallization layer 14 through a brazing material, thereby providing a seal.

As described above, according to the wiring substrate 100 of the first embodiment, a corner portion of the frame 12 assumes the form of the width-expanded portion 12A expanding toward the mounting region R, and the width-expanded portion 12A is, as viewed in plane, such that the entire inner wall surface 12C is rectilinear, and the inner wall surface 12C of the width-expanded portion 12A and the inner wall surface 12D of the frame 12 adjacent to the inner wall surface 12C of the width-expanded portion 12A form an obtuse angle α.

Thus, even though a portion other than corner portions of the frame 12 has a width d of 150 μm or less, while the wide mounting region R is secured, the via conductor 13 can be formed in the frame 12. Also, since the entire inner wall surface 12C of the width-expanded portion 12A is rectilinear, stamping workability is improved in manufacturing the frame 12 by use of a die. Thus, the productivity of the frame 12 is improved. Furthermore, since the via conductor 13 is not exposed from the inner wall surface 12C of the frame 12, there can be restrained the risk that a sealing brazing material flows along the via conductor 13 and undesirably comes into contact with a terminal of an electronic component.

Second Embodiment

Figure 3:
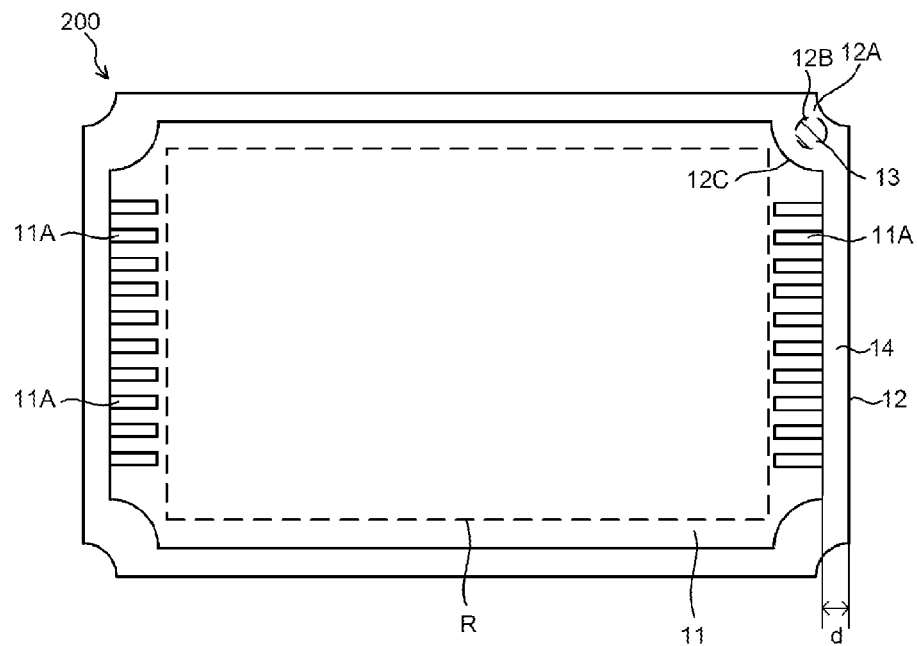
FIG. 3 is a plan view of a wiring substrate according to a second embodiment of the present invention.

FIG. 3 is a plan view of a wiring substrate 200 according to a second embodiment of the present invention. The wiring substrate 200 according to the second embodiment will next be described with reference to FIG. 3. Configurational features similar to those of the wiring substrate 100 having been described with reference to FIGS. 1 and 2 are denoted by like reference numerals, and repeated description thereof is omitted.

As shown in FIG. 3, the wiring substrate 200 differs from the wiring substrate 100 having been described with reference to FIGS. 1 and 2 in that, as viewed in plane, the entire inner wall surface 12C of the width-expanded portion 12A of the frame 12 is curved (has an arc shape) in such a manner as to protrude toward the mounting region R. By means of, as viewed in plane, the entire inner wall surface 12C of the width-expanded portion 12A of the frame 12 being curved (having an arc shape) in such a manner as to protrude toward the mounting region R, an area where the via hole 12B can be formed is widened, so that the via conductor 13 having a larger outside diameter can be formed. Other effects are similar to those of the wiring substrate 100 having been described with reference to FIGS. 1 and 2.

Other Embodiments

Figure 4:
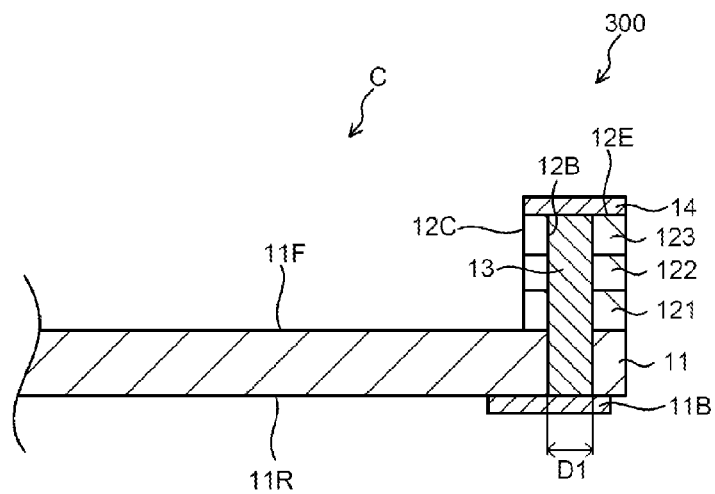
FIG. 4 is an enlarged fragmentary sectional view of a wiring substrate according to another embodiment of the present invention.

The present invention is not limited to the first and second embodiments described above. For example, as shown in FIG. 4, the present invention may be embodied in a wiring substrate 300 in which the frame 12 is composed of a plurality of insulating layers 121 to 123 laminated together. Also, the present invention can be applied to a wiring substrate in which a frame-like ring (seal ring) formed of an iron-nickel alloy or the like and coated with a nickel plating layer is bonded by brazing or the like to the sealing metallization layer 14, and a lid is brazed onto the ring for sealing in an electronic component.

In the first and second embodiments described above, the via conductor 13 is formed in a single width-expanded portion formed at a corner portion of the frame 12; however, the number of corner portions where the via conductor 13 is formed is not limited to one; i.e., the via conductor 13 may be formed in a plurality of corner portions which each assume the form of the width-expanded portion 12A. Also, in the above first and second embodiments, as shown in FIGS. 1 and 2, corner portions where the via conductor 13 is not formed each assume the form of the width-expanded portion 12A; however, the corner portions where the via conductor 13 is not formed may not assume the form of the width-expanded portion 12A.

Furthermore, in the first and second embodiments described above, the via hole 12B extends through the frame 12 and the insulating substrate 11 straight in the thickness direction and is filled with the via conductor 13, which electrically connects the metallization layer 14 and the external connection terminals 11B; however, a wiring substrate may be such that, as viewed in plane, the via hole 12B formed in the insulating substrate 11 and the via hole 12B formed in the frame 12 differ in position. In such a wiring substrate, the via conductor 13 charged into the via hole 12B of the insulating substrate 11 and the via conductor 13 charged into the via hole 12B of the frame 12 may be electrically connected through a wiring line.

The present invention is not limited to the structures and shapes of the above embodiments, but may be embodied with appropriate design change without departing from the spirit of the present invention.

DESCRIPTION OF REFERENCE NUMERALS

100, 200: wiring substrate
11: insulating substrate
11A: connection terminal
11B: external connection terminal
12: frame
12A: width-expanded portion
12B: via hole
12C: inner wall surface
12D: inner wall surface
12E: upper surface
13: via conductor
14: metallization layer
121 to 123: insulating layer

What is claimed is:

1. A wiring substrate comprising:

an insulating substrate having a substantially quadrangular planar shape and including a surface having a periphery and a mounting region for mounting of an electronic component;

a frame having a substantially quadrangular shape, positioned on the surface of the insulating substrate along the periphery of the surface, and surrounding the mounting region, the frame defining a cavity for accommodating the electronic component and including an upper surface, a corner portion, and an adjacent portion to the corner portion, the corner portion including a width-expanded portion expanding toward the mounting region and defining a via hole having a diameter of 100 μm or less and extending in a thickness direction, the width-expanded portion including an inner wall surface having a rectilinear edge in a plan view, the adjacent portion including an inner wall surface and having a width of 150 μm or less, and the inner wall surface of the width-expanded portion forming an obtuse angle with the inner wall surface of the adjacent portion;

a via conductor filling the via hole and not exposed from the inner wall surface of the width-expanded portion; and a sealing metallization layer formed on the upper surface of the frame and electrically connected to the via conductor.

2. A wiring substrate comprising:

an insulating substrate having a substantially quadrangular planar shape and including a surface having a periphery and a mounting region for mounting of an electronic component;

a frame having a substantially quadrangular shape, positioned on the surface of the insulating substrate along the periphery of the surface, and surrounding the mounting region, the frame defining a cavity for accommodating the electronic component and including an upper surface, a corner portion, and an adjacent portion to the corner portion, the corner portion including a width-expanded portion expanding toward the mounting region and defining a via hole having a diameter of 100 μm or less and extending in a thickness direction, the width-expanded portion including an inner wall surface having a curved edge protruding toward the mounting region in a plan view, the adjacent portion having a width of 150 μm or less;

a via conductor filling the via hole and not exposed from the inner wall surface of the width-expanded portion; and a sealing metallization layer formed on the upper surface of the frame and electrically connected to the via conductor.

\* \* \* \* \*